Sept. 21, 1965 E. F. JOHNSON 3,208,027

CONNECTOR FOR PRINTED CIRCUITS

Filed May 8, 1962

INVENTOR.
EDGAR F. JOHNSON

BY Carlsen & Carlsen

ATTORNEYS

United States Patent Office 3,208,027

Patented Sept. 21, 1965

3,208,027

CONNECTOR FOR PRINTED CIRCUITS

Edgar F. Johnson, Waseca, Minn., assignor to E. F. Johnson Company, Waseca, Minn., a corporation of Minnesota Filed May 8, 1962, Ser. No. 193,280

6 Claims. (Cl. 339—17)

This invention relates generally to electrical connectors and is more particularly directed to electrical connectors for use in association with printed circuit cards or panels.

Shortly before the beginning of World War II, the printed wiring technique in which conductors and components are securely mounted upon insulating cards or panels, was adapted to facilitate increased efficiency and speed in production of electrical and electronic equipment and apparatus. Numerous forms of components and devices and combinations of such components and devices with printed circuit or wiring panels have been developed for use therewith. In the evolution of this general art of constructing electrical and electronic equipment, it has been discovered that some of the familiar forms of test equipment and connectors cannot, because of the fact that the wiring and some of the components are substantially in one plane and securely affixed to the panel, function in the manner previously used. For example, it is very difficult if not impossible, to make a temporary connection to a printed circuit card at desired positions on the surface without actually soldering a connection or providing some sort of connector. Various forms of connectors to be included as a component of an assembled card are commercially available but, as will be noted below, the improvement with which this invention is concerned provides desirable features in its application and construction.

Considering the numerous ways in which an assembled printed circuit panel may be positioned or mounted in a piece of apparatus, it will be seen that access to reliable connectors may be required from various angles and positions with respect to the circuit panel. The present invention by providing suitable constructional features is useful and operable to allow for the temporary insertion of a plug for connection to predetermined portions of the circuit on a panel from four directions, icnluding the top and bottom of the circuit panel. It will be noted that the insertion of a plug in any of the above described directions provides for reliable and efficient electrical as well as mechanical connection to the connector.

In utilizing my invention, provisions for mounting the connector on and in association with a circuit panel are made in the normal manufacturing procedure, that is, perforations for connections to the electrical circuits and for the insertion of a plug are provided at appropriate locations at the same time the remainder of the circuit panel is fabricated. This may be done by drilling, punching or any other suitable methods for providing such perforations. A connector constructed according to the principles of my invention is then mounted and permanently connected to the panel and circuit. It will therefore be seen that the assembled circuit panel, including the connector, is provided with increased utility in allowing a greater flexibility for temporary connection to the circuit panel and further provides an efficient reliable connector for the reception of suitable plugs.

It is therefore an object of the present invention to provide an improved solderless electrical connector.

Another object of the present invention is to provide an improved electrical circuit panel or temporary connection to external circuitry.

It is a still further object of the present invention to provide an improved solderless connector which may be manufactured in a more economical manner than the previously attained.

It is a still further object of the present invention to provide a solderless connector having access openings for the insertion for the plug therein along at least two of its axes.

Another object of the present invention is to provide a solderless connector for use with printed circuit panels which frictionally engages a plug at the intersection of two transverse openings.

These and other more detailed objects will become apparent from a consideration of the appended specification, claims and drawings in which:

Figures 1, 2, 3:
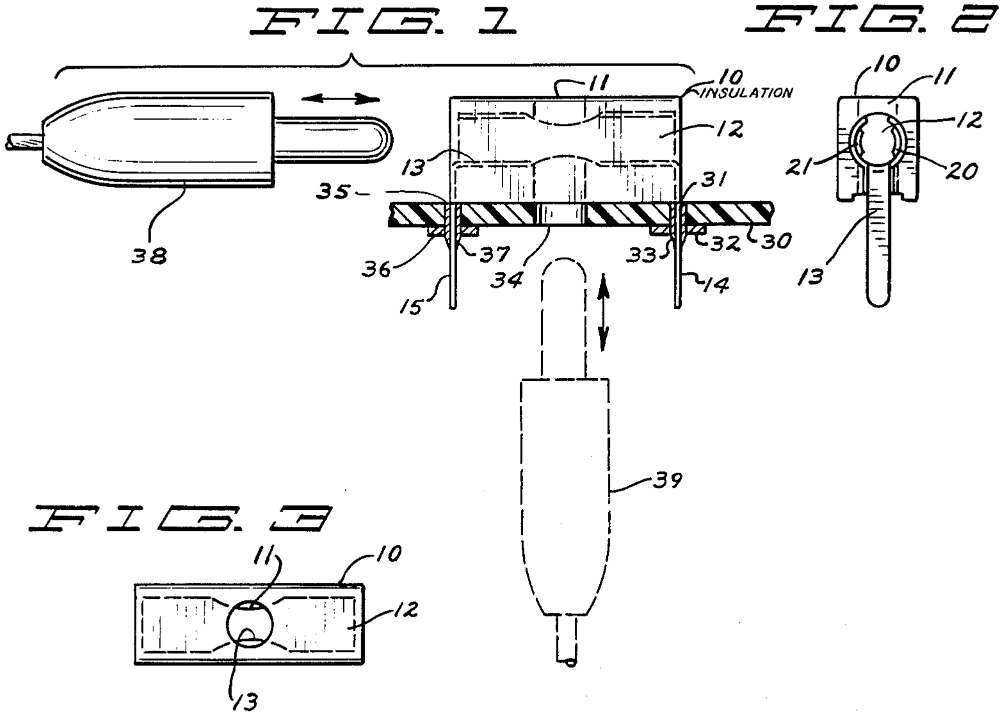
FIG. 1 is a sketch of an assembled circuit panel including a connector for providing temporary connection to external circuitry.
FIG. 2 is an end view of an assembled solderless connector.
FIG. 3 is a top view of the connector shown in FIGURES 1 and 2.

Referring now to FIG. 1 of the drawings, there is shown a circuit panel upon which is mounted a solderless connector 10. The circuit panel is comprised of an insulating base 30 having conductors 32 and 36 affixed thereto. A plurality of openings 31, 34 and 35 are provided for coaction with solderless connector 10. Perforations or openings 31 and 35 extend through conductors 32 and 36 respectively. Perforation 34 extends through the insulating base member 30.

Connector 10 is constructed of a body of suitable dielectric or insulating material and includes a longitudinally extending opening 12 and a transversely extending opening 11 which intersect in the middle in the manner show. A conductive insert 13, having a pair of tabs or extensions 14 and 15, is mounted on the inside of the longitudinally extending opening, or channel 12. It may be noted that the conductive insert is held in position by virtue of the fact that the extensions 14 and 15 are bent at right angles and lie in the grooves at either end of insulating body 12 so as to present an essentially flush surface at either end. Extensions 14 and 15 are electrically and mechanically connected to conductors 32 and 33 through soldered connections 33 and 37 respectively. The bottom surface of the connector lies on the opposite surface of the card and is securely held in place in this manner. While only a portion of a circuit panel has been illustrated, it may be clear to those skilled in the art that a number of solderless connector devices, 10, may be positioned at appropriate locations on either surface of the circuit panel.

A pair of plugs for connection to an external circuit, are shown in relative operating positions and it will be seen that they are readily insertable and removable from the connector. Plug 38 may be inserted from either end of the longitudinal opening 12 and plug 39 may be inserted from either end of the longitudinal transverse opening 11. In either event, an efficient and reliable connection is made to conductive lining or insert 13 at the intersection of the two openings by frictional engagement of the slightly bowed portions 20 and 21 (FIG. 2) of the conductive metal lining. The dimensions of connector 10, lining 13 and plugs to be inserted therein may be of any suitable size commensurate with particular applications and, of course, may vary from one application to another.

Figures 4, 5, 6:
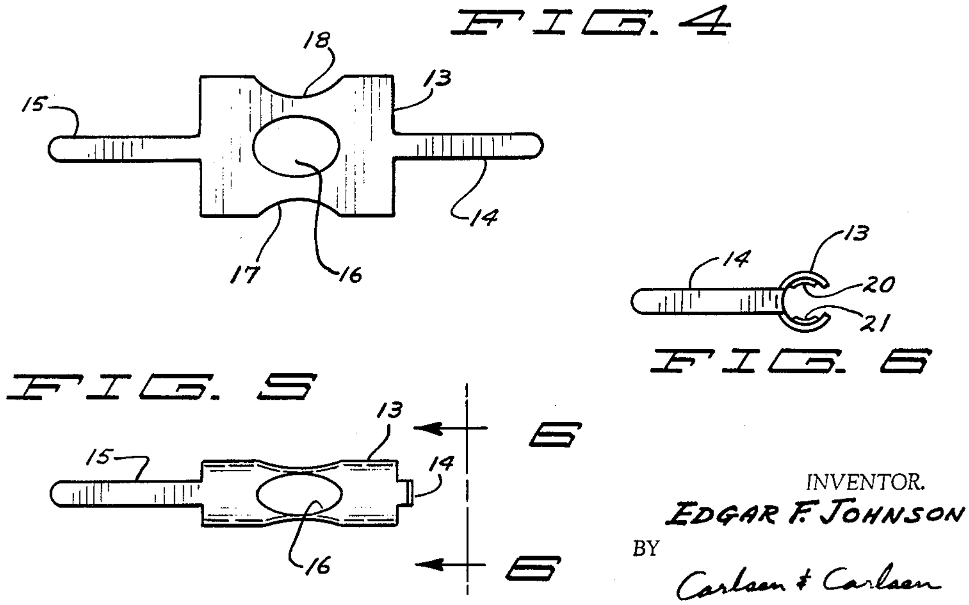
FIG. 4 is a top view of a blank of conductive material from which the conductive lining of the device in FIGURES 2 and 3 is formed.
FIG. 5 is a bottom view of a partially formed conductive insert.
FIG. 6 is an end view of a formed conductive insert.

In FIG. 4, there is shown a blank from which the conductive lining 13 is formed. The blank is made up of a main body having a longitudinal center line with an elliptical opening 16, substantially at the center, complementary shaped side portions having semi-elliptical notches 17 and 18 and a pair of longitudinally extending end members 14 and 15. The blank is formed to the shape shown in the end view of FIG. 6 to provide the conductive lining 13. A mandrel of suitable size may be used to provide the tubular shape of the main body. The inwardly bowed portions 20 and 21 may be formed by any suitable metal forming methods.

Conductive lining 13 may be constructed of electrically conductive material having suitable spring characteristics for providing resiliency at least of the material between the semi-elliptical notches and the elliptical opening. A suitable material, .008" thickness beryllium copper, was found to be acceptable for this purpose. The blank may be formed by suitable methods, for example, the use of a punch and die. Certain applications may require the increased conductivity and resistance to oxidation of suitable plating materials. In one embodiment, a silver plating of .0002 inch was found to be acceptable and provided the desired performance.

It is understood that suitable modifications may be made in the structure as disclosed, provided such modifications come within the spirit and scope of the appended claims. Having now therefore fully illustrated and described my invention, what I claim to be new and desire to protect by Letters Patent is:

1. In combination: an insulating base member, having conductors positioned thereon and perforations in predetermined relationship thereto; and a socket for receiving and frictionally engaging a plug, said socket having longitudinal and transverse channels therein, said transverse channel being aligned with one of said perforations, said socket having a conductive lining therein including a pair of extensions for connection to selected portions of said conductors, said conductive lining including a pair resilient inwardly extending portions on opposite sides of said transverse channel.

2. A connector for use with printed circuit boards and the like, comprising: a longitudinally elongated member comprised of insulating material having an opening along the longitudinal axis thereof and a further opening extending transversely therethrough whereby access to the intersection of said openings may be attained from four sides of said body; and a conductive lining comprised of a member of electrically conductive material having an elliptical opening at the center of the longitudinal axis thereof, complementary side portions having elliptical notches adapted to lie in registration with said opening, said lining being formed in arcuate shape corresponding to the size of the longitudinal opening in said member and having inwardly bowed portions intermediate said elliptical opening and notches, and a pair of longitudinally extending portions for insertion into openings therefor in a circuit element.

3. A connector for use with printed circuit boards and the like, comprising: a longitudinally elongated member comprised of insulating material having an interior channel along a first axis thereof and a further interior channel extending transversely therethrough whereby access to the intersection of said channels may be attained from four sides of said body; and a conductive lining comprised of an elongated body of electrically conductive material having an opening at the intersection of said channels and complementary side portions having notches adapted to lie in registration with said opening, said lining being formed in arcuate shape corresponding to the size of the longitudinal opening in said member whereby resilient and frictional engagement with a plug may be obtained at the intersection of said channels and having a pair of longitudinally extending portions for insertion into openings therefor in a circuit element.

4. The connector of claim 3, in which the lining has a pair of complementary inwardly extending portions positioned at the intersection of the channels.

5. A connector for use with printed circuit boards and the like, comprising: a longitudinally elongated member having interior intersecting channels extending therethrough such that access to the intersection of said channels may be attained from four sides of said member; and a conductive lining comprised of an elongated body of electrically conductive material having an opening at the intersection of said channels, complementary side portions having notches in registration with said opening, said lining being formed in a shape corresponding to one of said channels and having inwardly bowed portions intermediate said opening and said notches and positioned at the intersection of said channels and a pair of depending portions for insertion into openings therefor in a circuit element.

6. A connector for use with printed circuit boards and the like, comprising: a longitudinally elongated member having an orifice extending longitudinally therethrough and a further orifice extending transversely therethrough and intersecting said longitudinal orifice; and a conductive lining extending through one of said orifices, said conductive lining having a transverse opening in registration with the other of said orifices and resilient inwardly extending side portions on opposite sides of said transverse opening adapted to frictionally engage a plug inserted in either of said orifices and having terminal portions extending outwardly of said longitudinally elongated member.

References Cited by the Examiner

UNITED STATES PATENTS

| | | | |
|---|---|---|---|
| 2,206,799 | 7/40 | Barton | 339—258 X |
| 2,550,237 | 4/51 | Franklin | 339—258 |
| 2,664,550 | 12/53 | Howard | 339—128 |
| 2,796,593 | 6/57 | Offerman | 339—193 X |
| 2,951,226 | 8/60 | Gittens | 339—17 |
| 2,958,065 | 10/60 | Flanagan | 339—17 |

FOREIGN PATENTS

| | | |
|---|---|---|
| 379,720 | 9/07 | France. |
| 1,036,969 | 8/58 | Germany. |

JOSEPH D. SEERS, *Primary Examiner.*

M. HENSON WOOD, Jr., *Examiner.*